(12) United States Patent
Komaba

(10) Patent No.: US 9,712,769 B2
(45) Date of Patent: Jul. 18, 2017

(54) IMAGING DEVICE

(71) Applicant: NIKON CORPORATION, Tokyo (JP)

(72) Inventor: Takafumi Komaba, Sagamihara (JP)

(73) Assignee: NIKON CORPORATION, Tokyo (JP)

(*) Notice: Subject to any disclaimer, the term of this patent is extended or adjusted under 35 U.S.C. 154(b) by 0 days.

(21) Appl. No.: 14/368,099

(22) PCT Filed: Dec. 27, 2012

(86) PCT No.: PCT/JP2012/008394
§ 371 (c)(1),
(2) Date: Nov. 5, 2014

(87) PCT Pub. No.: WO2013/099266
PCT Pub. Date: Jul. 4, 2013

(65) Prior Publication Data
US 2015/0062393 A1 Mar. 5, 2015

(30) Foreign Application Priority Data
Dec. 28, 2011 (JP) ................ 2011-288160

(51) Int. Cl.
H04N 5/369 (2011.01)
H04N 5/374 (2011.01)
(Continued)

(52) U.S. Cl.
CPC ........ H04N 5/3698 (2013.01); H04N 5/3577 (2013.01); H04N 5/374 (2013.01);
(Continued)

(58) Field of Classification Search
CPC ............ H04N 5/3698; H04N 5/37455; H04N 5/37457; H04N 5/3741; H04N 5/3577; H04N 5/378; H04N 5/374
See application file for complete search history.

(56) References Cited

U.S. PATENT DOCUMENTS

| 2008/0049130 A1 | 2/2008 | Koizumi et al. |
| 2009/0065929 A1* | 3/2009 | Hiranuma et al. ............ 257/724 |
| 2013/0221470 A1* | 8/2013 | Kinsman ........... H01L 27/14618 257/434 |

FOREIGN PATENT DOCUMENTS

| JP | H06-163700 A | 6/1994 |
| JP | A-2003-168791 | 6/2003 |
(Continued)

OTHER PUBLICATIONS

International Search Report issued in PCT/JP2012/008394 mailed Mar. 12, 2013.
(Continued)

Primary Examiner — Padma Haliyur
(74) Attorney, Agent, or Firm — Oliff PLC

(57) ABSTRACT

An image sensor having a pixel part generating a signal in accordance with a light, a signal processing part performing signal processing on the signal read from the pixel part, and a power supply part connected to the signal processing part via a first wiring, and supplying a power supply to the signal processing part, and a storage package storing the image sensor, and having a second wiring configuring a parallel circuit by being connected to the first wiring. Accordingly, it is possible to solve a problem such that a wiring resistance is increased when a power supply circuit is configured inside of a solid state image sensor.

15 Claims, 9 Drawing Sheets

(51) Int. Cl.
    *H04N 5/357*     (2011.01)
    *H04N 5/378*     (2011.01)
    *H04N 5/3745*    (2011.01)

(52) U.S. Cl.
    CPC .......... *H04N 5/378* (2013.01); *H04N 5/3741* (2013.01); *H04N 5/37455* (2013.01); *H04N 5/37457* (2013.01)

(56)  References Cited

FOREIGN PATENT DOCUMENTS

| JP | 2006-129255 A | 5/2006 |
| JP | 2007-317719 A | 12/2007 |
| JP | 2008-054246 A | 3/2008 |
| JP | 2010-141543 A | 6/2010 |
| JP | A-2010-239604 | 10/2010 |
| JP | 5907176 B2 | 4/2016 |

OTHER PUBLICATIONS

International Preliminary Report on Patentability issued in PCT/JP2012/008394 issued Jul. 1, 2014 (with translation).
Sep. 8, 2015 Office Action issued in Japanese Application No. 2013-551471.
Nov. 8, 2016 Office Action issued in Japanese Application No. 2016-037218.
Sep. 5, 2016 Office Action issued in Chinese Application No. 201280065092.0.
Jun. 6, 2017 Office Action issued in Japanese Application No. 2016-037218.

* cited by examiner

IMAGING DEVICE

CROSS REFERENCE TO RELATED APPLICATION

This application is a U.S. National Stage application claiming the benefit of prior filed International Application Number PCT/JP2012/008394, filed Dec. 27, 2012, in which the International Application claims a priority date of Dec. 28, 2011, based on prior filed Japanese Application Number 2011-288160, the entire contents of which are incorporated herein by reference.

TECHNICAL FIELD

The present application relates to an imaging device.

BACKGROUND ART

A CMOS sensor which has been mounted on a large number of electronic cameras in recent years has a plurality of pixels arranged on a light-receiving surface in a matrix form, and accumulates an electric charge in accordance with an incident light in each of the pixels. Further, a conversion into an electrical signal in accordance with an amount of electric charge accumulated in an amplification transistor is performed, and the electrical signal is read to a vertical signal line via a selection transistor. The signal read to the vertical signal line from each pixel is read to an outside of the CMOS sensor via a PGA circuit (Programmable Gain Amplifier), an ADC circuit (AD conversion circuit) and the like disposed for each column (refer to Patent Document 1, for example).

Patent Document 1: Japanese Unexamined Patent Application Publication No. 2010-239604

DISCLOSURE OF THE INVENTION

Problems to be Solved

However, when a power supply circuit which supplies a bias power supply and the like to circuits disposed for respective columns is configured inside of a solid state image sensor, a wiring supplied from the internal power supply circuit to the circuits disposed for the respective columns has to be routed over a long distance in a column direction. Meanwhile, there is a limitation in an area of the solid state image sensor, and it is not possible to sufficiently increase a width and a thickness of the wiring, so that a wiring resistance is increased, which is a problem. In a full-size CMOS sensor in particular, a length of wiring in a column direction becomes long, so that a voltage drop due to a wiring resistance becomes large.

In view of the above-described problems, a proposition of the present invention is to provide an imaging device capable of reducing a wiring resistance of a wiring supplied from a power supply circuit formed inside of a solid state image sensor to circuits disposed for respective columns.

Means for Solving the Problems

An imaging device according to the present invention is characterized in that it includes an image sensor having a pixel part generating a signal in accordance with a light, a signal processing part performing signal processing on the signal read from the pixel part, and a power supply part connected to the signal processing part via a first wiring, and supplying a power supply to the signal processing part, and a storage package storing the image sensor, and having a second wiring configuring a parallel circuit by being connected to the first wiring.

Further, it is characterized in that the signal processing part includes an amplifier amplifying the signal read from the pixel part, and outputting the signal being amplified.

Further, it is characterized in that the signal processing part includes an A/D converting part converting the signal read from the pixel part into a digital signal, and outputting the digital signal.

In particular, it is characterized in that the second wiring is formed in the storage package.

Further, it is characterized in that the storage package is made of a ceramic.

Alternatively, it is characterized in that the storage package is made of a resin.

An electronic camera according to the present invention is characterized in that it includes the imaging device.

Effects

An imaging device according to the present invention can reduce, when a power supply circuit is configured inside of a chip device, a wiring resistance of a wiring supplied from the internal power supply to circuits disposed for respective columns.

DETAILED DESCRIPTION OF THE EMBODIMENTS

Figure 1:
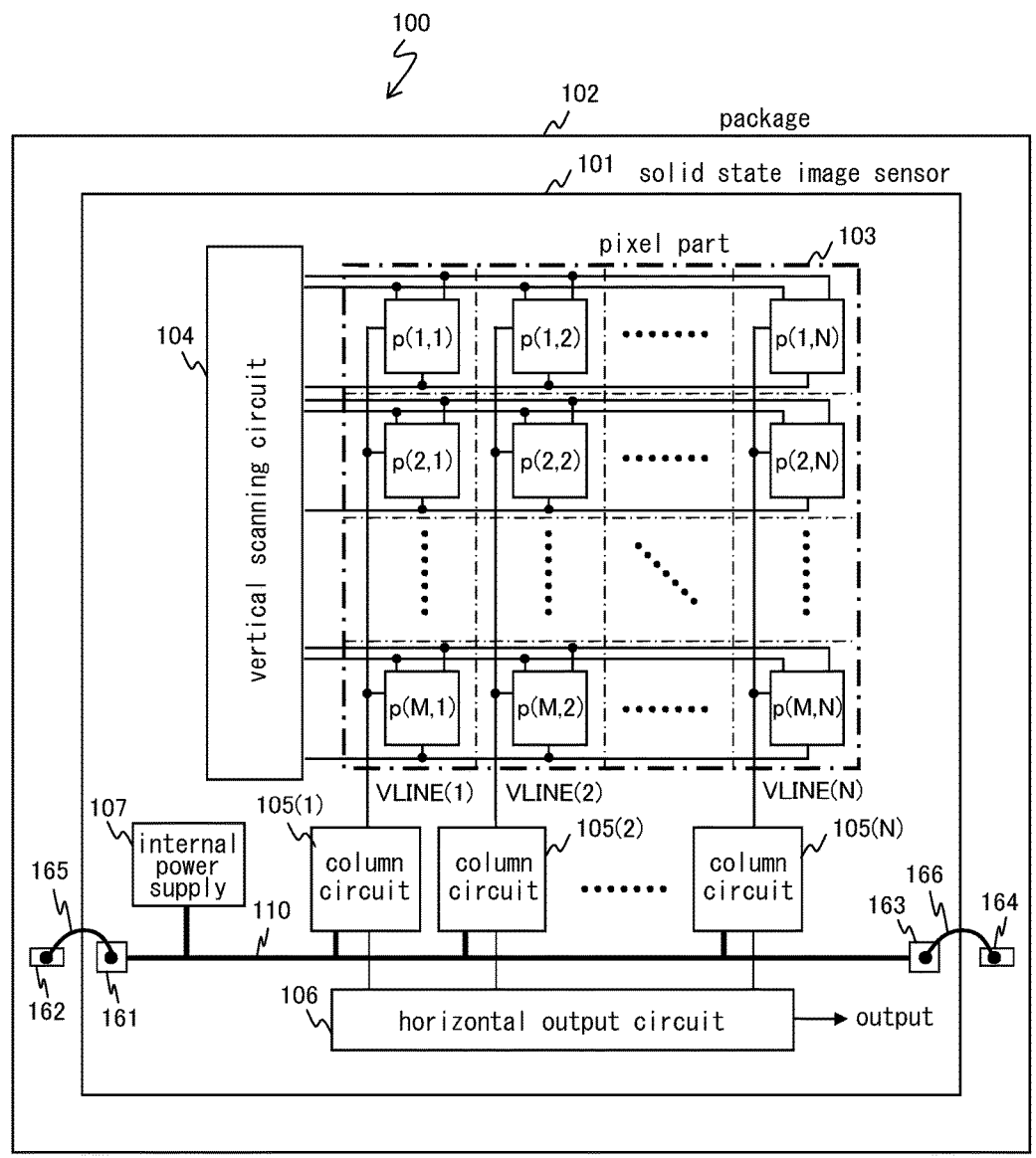
FIG. 1 is a diagram illustrating a configuration example of an imaging device 100.

Hereinafter, an embodiment of an imaging device according to the present invention will be described in detail by using the drawings. FIG. 1 is a block diagram illustrating a configuration of an imaging device 100 according to the present invention.

In FIG. 1, the imaging device 100 is configured by a solid state image sensor 101 obtained by forming circuits on a semiconductor substrate, and a package 102 storing the solid state image sensor 101.

The solid state image sensor 101 has a pixel part 103, a vertical scanning circuit 104, column circuits 105, a horizontal output circuit 106, and an internal power supply 107.

The pixel part 103 has a plurality of pixels p arranged in a matrix form (N rows by M columns). Further, each pixel p has a photodiode which accumulates an electric charge in accordance with an amount of incident light, an amplification transistor which performs conversion into an electrical signal in accordance with an amount of the accumulated electric charge and amplifies the electrical signal, a selection transistor which reads the amplified electrical signal to a vertical signal line VLINE in response to a timing signal given by the vertical scanning circuit 104, and the like. Note that detailed explanation regarding a circuit and an operation of the pixel p will be omitted.

The vertical scanning circuit 104 gives a timing at which the photoelectric-converted electrical signal is read from each pixel p of the pixel part 103 to the vertical signal line VLINE. Note that although a signal, a reference clock and the like for controlling an operation of the vertical signal line 104 are given from the outside, an illustration thereof is omitted in FIG. 1.

The column circuit 105 includes all of circuits provided for each vertical signal line VLINE, and in the present embodiment, the column circuit 105 includes circuits such as a PGA circuit 151 and an ADC circuit 152, and the column circuit 105 may also include a CDS circuit (correlation double sampling circuit) and the like. Note that the PGA circuit 151 and the ADC circuit 152 will be described later in detail.

The horizontal output circuit 106 is a circuit which outputs a signal output from the column circuit 105, to the outside for each column. For example, an analog signal read to the vertical signal line VLINE for each row from the pixel part 103 and output via the column circuit 105 or digital data as a result of being subjected to digital conversion in the ADC circuit 152, of one row, is temporarily held, and sequentially output to the outside in a unit of pixel, by the horizontal output circuit 106.

The internal power supply 107 is a power supply circuit disposed inside of the solid state image sensor 101 for supplying a power supply to the column circuits 105. For example, to the PGA circuit 151, a bias power supply and a reference voltage VREF are given by the internal power supply 107. Further, to the ADC circuit 152, a reference voltage VRB on a low voltage side at a time of AD conversion is given by the internal power supply 107.

Here, in the following description, when a specific pixel out of N by M pieces of pixels p is indicated, a notation is made such as, for example, pixel p (1, 1) by adding coordinates (row number, column number), and if any of all of the pixels is indicated, a notation is made as pixel p, by omitting the coordinates. Further, similarly, also regarding the vertical signal line VLINE or the column circuit 105, when the vertical signal line VLINE or the column circuit 105 of a specific column is indicated, a notation is made such as, for example, vertical signal line VLINE (1) or column circuit 105 (1) by adding (column number), and if any of all of the vertical signal lines or any of all of the column circuits is indicated, a notation is made as vertical signal line VLINE or column circuit 105, by omitting the column number.

In FIG. 1, the solid state image sensor 101 is stored in the package 102, and pads on the solid state image sensor 101 side and lead pins on the package 102 side are connected by bonding wires. Note that in FIG. 1, a pad 161 at a left end and a pad 163 at a right end of a wiring 110 (an internal wiring of the solid state image sensor 101 (corresponding to a first wiring)) that supplies a power supply from the internal power supply 107 related to the description of the present embodiment to the column circuits 105, and a lead pin 162 and a lead pin 164 on the package side are connected, respectively, by bonding wires.

Figure 2:
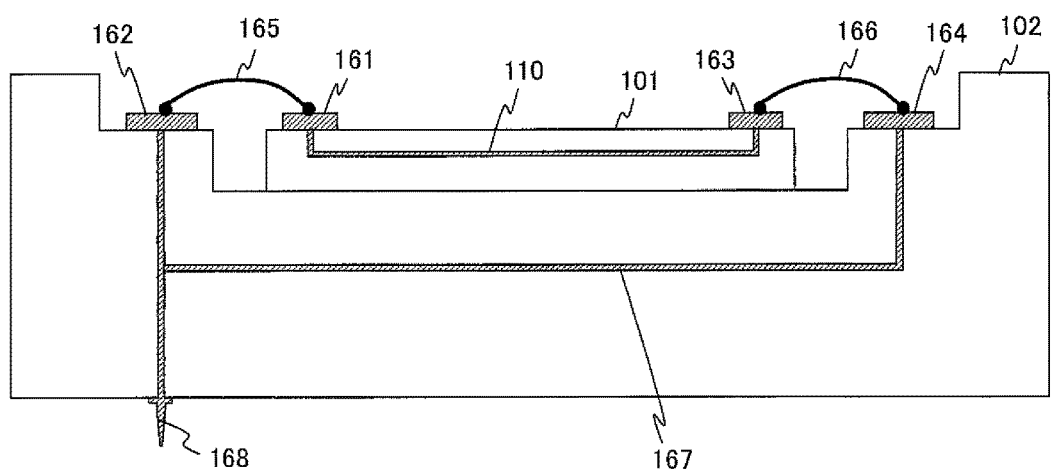
FIG. 2 is a sectional view of a solid state image sensor 101 and a package 102.

Here, a state of a cross section of the imaging device 100 is illustrated in FIG. 2. FIG. 2 is a diagram illustrating a state where the solid state image sensor 101 is stored in the package 102, in which the solid state image sensor 101 is disposed in the package 102 which is processed in a stepped pattern. Further, the lead pin 162 disposed on a middle step of the package 102 processed to have a height same as that of the solid state image sensor 101, and the pad 161 at the left end of the solid state image sensor 101 are connected by a bonding wire 165 made of gold. In like manner, the pad 163 at the right end of the solid state image sensor 101 and the lead pin 164 disposed on the middle step of the package 102, are connected by a bonding wire 166 made of gold. Note that as described in FIG. 1, the pad 161 at the left end and the pad 163 at the right end on the solid state image sensor 101 are connected by the wiring 110 inside of the solid state image sensor 101, and the power supply is supplied from the internal power supply 107 to the column circuits 105.

In FIG. 2, the lead pin 162 and the lead pin 164 penetrate through the package 102 and are led to an external pin 168 of the imaging device 100. Note that the external pin 168 is a terminal for monitoring a voltage VRB to check an operation of the internal power supply 107. Here, in the imaging device 100 according to the present embodiment, the package 102 is configured by a stacked-type package, and the lead pin 162 and the lead pin 164 are connected by a wiring 167 (an external wiring of the solid state image sensor 101 (corresponding to a second wiring)) disposed between layers. Accordingly, the internal wiring 110 of the solid state image sensor 101 and the external wiring 167 disposed between the layers of the package 102 are disposed in parallel, resulting in that a wiring resistance can be reduced. For example, if a resistance of the wiring 110 is set to R1, and a resistance of the wiring 167 is set to R2, a resistance R3 between the pad 161 at the left end and the pad 163 at the right end on the solid state image sensor 101, is determined by an expression of $1/R3=1/R1+1/R2$.

In a manner as described above, a voltage drop of the power supply voltage supplied from the internal power supply 107 disposed at the left end or the right end of the column circuits 105, due to the wiring resistance, can be reduced.

Figure 4:
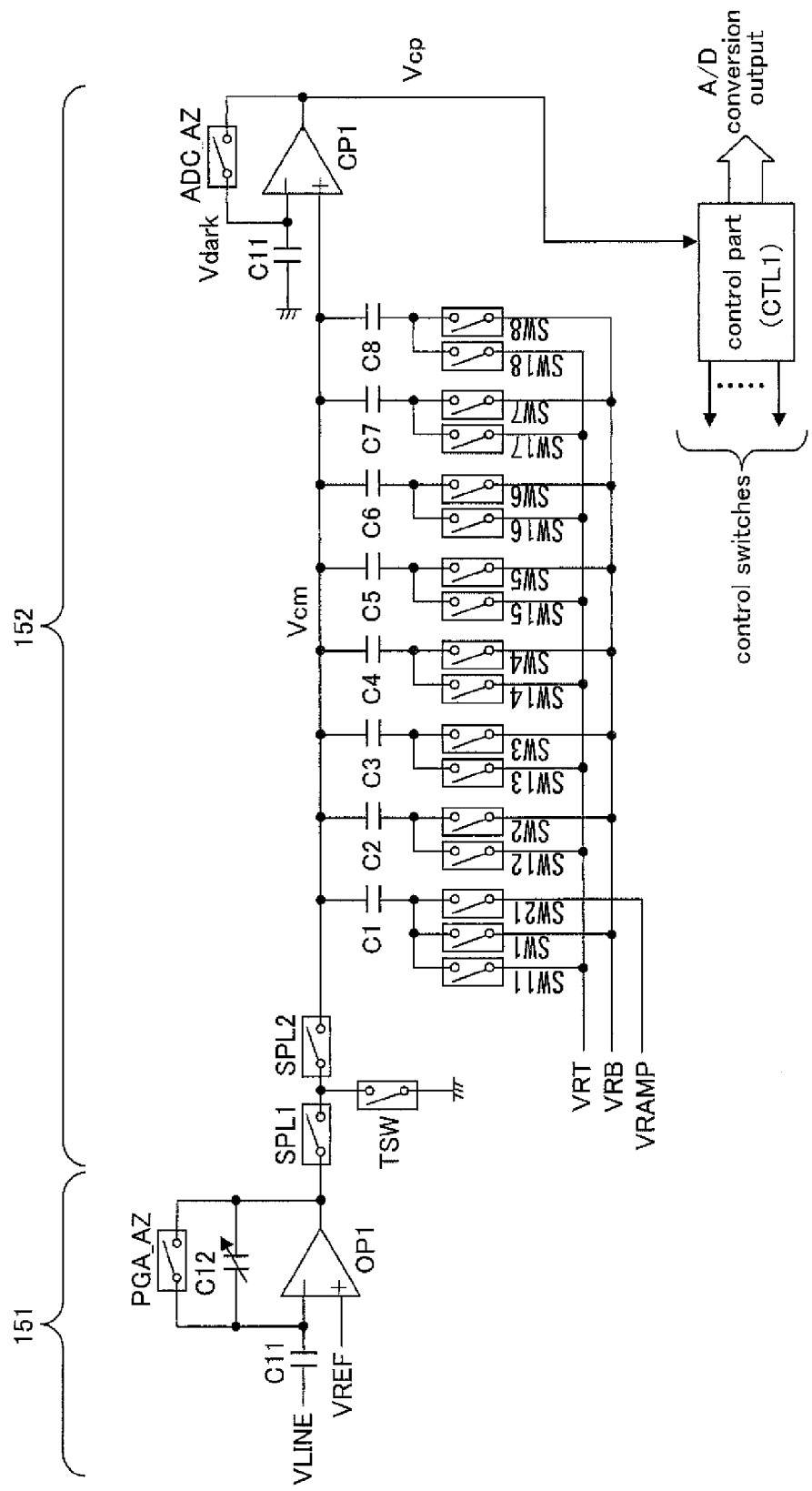
FIG. 4 is a diagram illustrating a configuration example of an integrating type A/D converter.

Next, a problem when the voltage drop due to the wiring resistance is large, will be described. FIG. 4 a diagram illustrating an example of circuits of the PGA circuit 151 and the ADC circuit 152, as an example of the column circuit 105.

In FIG. 4 the PGA circuit 151 is formed of an operational amplifier OP1, a capacitor C11, a variable capacitor C12, and a switch PGA_AZ. An electrical signal read from the pixel p to the vertical signal line VLINE is input into a negative input terminal (−) of the operational amplifier OP1 through the capacitor C11. Here, to a positive input terminal (+) of the operational amplifier OP1, a reference voltage VREF is given from the internal power supply 107. Further, the electrical signal is amplified by a gain determined by a ratio between the variable capacitor C12 for negative feedback and the capacitor C11 on the input side, and the resultant is output from the operational amplifier OP1. Note that the switch PGA_AZ is a switch for resetting an electric charge accumulated in the variable capacitor C12, and actually, by the switch, the reset is performed, an electrical signal of the pixel p before exposure (dark signal) is read, and then an electrical signal of the pixel p after the exposure (optical signal) is read, thereby correcting a variation of circuits of respective pixels.

The ADC circuit 152 is an A/D conversion circuit for converting an analog signal output from the PGA circuit 151 into digital data. Although various types of A/D conversion circuits are known, here, examples of commonly-used successive approximation type A/D converter and integrating type A/D converter will be described. Note that the present invention can be similarly applied to an A/D converter of another type if the A/D converter uses a voltage supplied from the internal power supply 107.

[Example of Successive Approximation Type A/D Converter]

Figure 3:
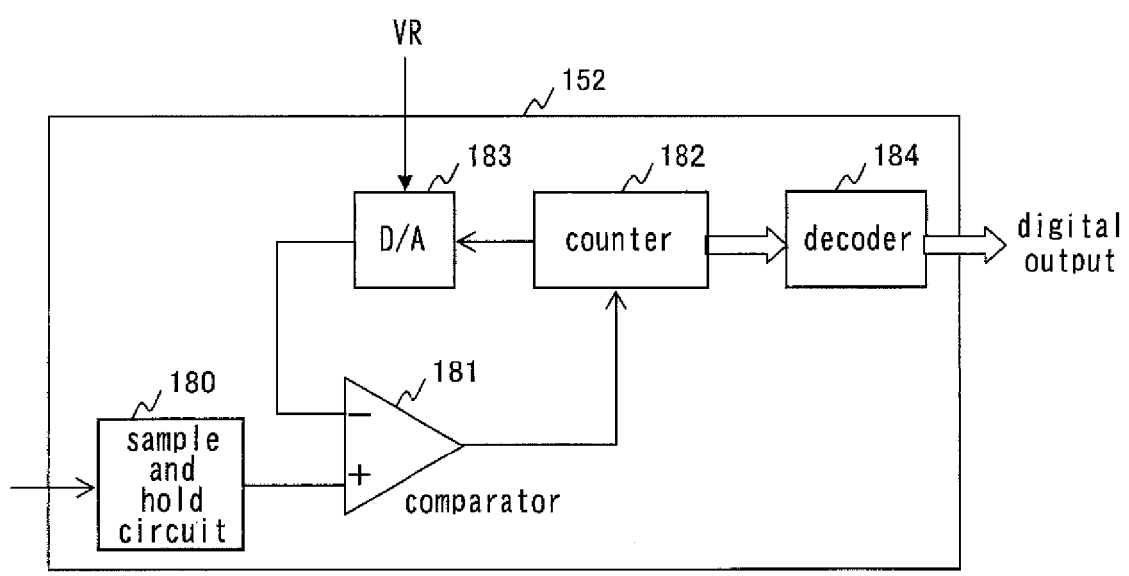
FIG. 3 is a diagram illustrating a configuration example of a successive approximation type A/D converter.

FIG. 3 is an example of circuit of a commonly-used successive approximation type ADC circuit 152. The successive approximation type ADC circuit 152 is formed of a sample-and-hold circuit 180, a comparator 181, a counter 182, a D/A converter 183, and a decoder 184. An electrical signal output from the PGA circuit 151 is once held in the sample-and-hold circuit 180, and is compared with an output voltage of the D/A converter 183 in the comparator 181. Further, for example, when the output voltage of the D/A converter 183 becomes greater than the voltage held in the sample-and-hold circuit 180, a counting of the counter 182 is stopped, and a value as a result of performing decoding on a count value of the counter in the decoder 184, is output as digital data after A/D conversion. Here, a reference voltage VR is given to the D/A converter 183, and if the reference voltage VR varies between columns due to a resistance component of the wiring 110, there arises a problem such that the digital data after the A/D conversion also varies between the columns. Note that a similar problem arises also when, not the reference voltage VR, but a bias power supply of the comparator 181 is supplied from the internal power supply 107 in the solid state image sensor 101.

Further, there is also a case where a phenomenon (smear) occurs in which pixels on the same row become black or white when a strong light is incident on a part of screen. This is because, when the reference voltage VR is supplied from the internal power supply 107 disposed on one side of the solid state image sensor 101, since the wiring 110 is a common wiring, a flowing current becomes large due to the incidence of the strong light, which exerts an influence on the ADC circuit 152 on another column.

[Example of Integrating Type A/D Converter]

Next, an example of a case where the ADC circuit 152 is an integrating type A/D conversion circuit, will be described. FIG. 4 illustrates an example of circuit when the integrating type A/D converter is used as the ADC circuit 152. Further, FIG. 5 is a timing chart of a main part of the ADC circuit 152 in FIG. 4.

In FIG. 4, a signal read to the vertical signal line VLINE is amplified by the PGA circuit 151, and after that, the resultant is sampled and held in capacitors C1 to C8 by a switch SPL1 and a switch SPL2 on a front stage of the ADC circuit 152, and then converted into digital data. Note that to the ADC circuit 152, a voltage VRB is given from the internal power supply 107 via the wiring 110. The voltage VRB is a reference voltage on a low voltage side in A/D conversion, and is set to 1 V, in this case. Further, a voltage VRT is a reference voltage on a high voltage side in A/D conversion, and is set to 2 V, in this case. Further, as a ramp voltage VRAMP, a voltage with ramp output waveform is given.

Figure 5:
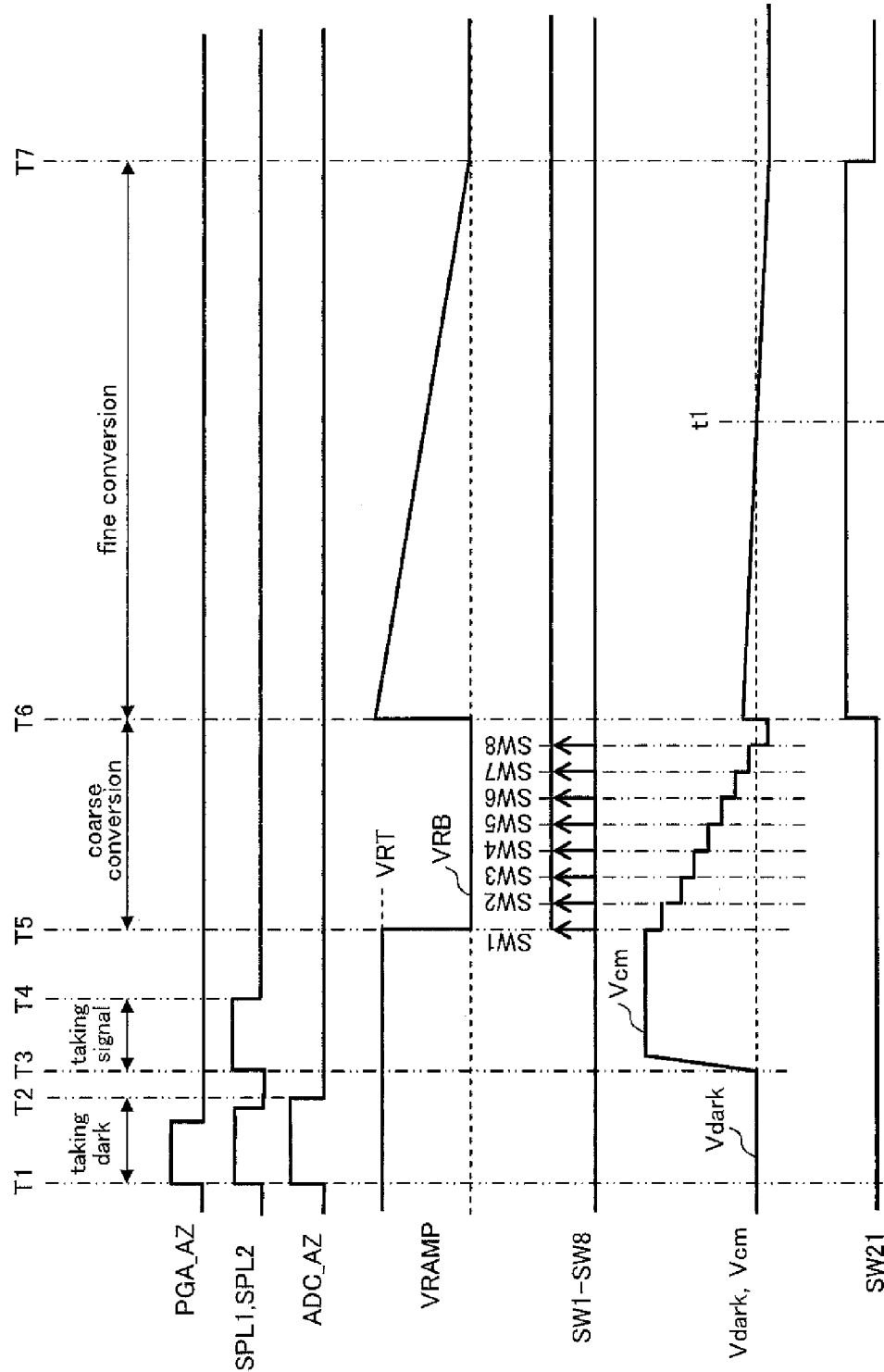
FIG. 5 is a timing chart of the integrating type A/D converter.

First, at a timing T1 in FIG. 5, the two switches SPL1 and SPL2 disposed on the front stage of the ADC circuit 152, the switch PGA_AZ, and a switch ADC_AZ are turned on, and a dark signal (signal of pixel when no exposure is performed) is taken in a capacitor C10 during a period of time up to when a timing T2 is started. Subsequently, the switch SPL1 and the switch SPL2 are turned on at a timing T3, at which a signal (signal of pixel when exposure is performed) is started to be taken in, and at a point of time at which the switch SPL1 and the switch SPL2 are turned off at a timing T4, the signal is taken in as a voltage Vcm of the capacitors C1 to C8. Note that during this period of time, switches SW11 to SW18 are in a state of being turned on, and counter electrodes of the capacitors C1 to C8 are connected to the voltage VRT. Here, switches SW12 to SW18 connected to the voltage VRT and switches SW2 to SW8 connected to the voltage VRB operate in a mutually exclusive manner such that, for example, when the switch SW2 is turned on, the switch SW12 is turned off, and conversely, when the switch SW2 is turned off, the switch SW12 is turned on. Note that the switches SW1 and SW11 operate in an exclusive manner in a coarse conversion, but, in a fine conversion, both of the switches SW1 and SW11 are turned off, and a switch SW21 is turned on.

During a period of time from the next timing T5 to T6, a coarse conversion (coarse A/D conversion) is performed. In an example of FIG. 5, a high-order 3-bit digital value is determined in the coarse conversion. First, when the switch SW1 connected to the capacitor C1 is turned on (exclusively, the switch SW11 is turned off) at the timing T5, one side of the capacitor C1 is switched from the voltage VRT to the voltage VRB, resulting in that the voltage Vcm of the signal is dropped by (VRT−VRB)/8. Subsequently, when the switch SW2 connected to the capacitor C2 is turned on (exclusively, the switch SW12 is turned off), one side of the capacitor C2 is switched from the voltage VRT to the voltage VRB, resulting in that the voltage Vcm of the signal is further dropped by (VRT−VRB)/8. Hereinafter, the voltage Vcm of the signal is dropped, in stages, by (VRT−VRB)/8, in a similar manner, every time each of the switches SW3 to SW8 is turned on. Further, at a point of time at which an output of a comparator CP1 is inverted, the switching of the switches SW1 to SW8 is stopped, and an on-off state of the switches SW1 to SW8 at that time is converted into a 3-bit digital value. In an example of FIG. 5, the output of the comparator CP1 is inverted at a point of time at which the switch up to the switch SW8 is turned on, so that a high-order 3-bit value after the A/D conversion becomes "111".

During a period of time from the next timing T6 to T7, a fine conversion (fine A/D conversion) is performed. When the ADC circuit 152 forms an 8-bit A/D converter, a high-order 3-bit digital value is determined through the coarse conversion, and a low-order 5-bit digital value is determined through the fine conversion. First, the switch SW21 is turned on (both of the switches SW1 and SW11 are turned off) at the timing T6 at which the ramp voltage VRAMP is given, and during a period of time from the timings T6 to T7, the voltage changes from the voltage VRT to the voltage VRB. Further, a period of time between a timing t1 at which the output of the comparator CP1 is inverted again and the timing T6 is measured, and low-order 5 bits are determined based on a time ratio. For example, a period of time from the timings T6 to T7 is divided equally by a quantization width of 5 bits (decimal number: 32), and the low-order 5 bits are determined in accordance with a period of time from the timing T6 to the timing t1. For example, when the timing t1 exists in the middle of the timings T6 to T7, the low-order 5 bits correspond to "10000 (decimal number: 16)". Note that here, the case where the 8-bit A/D conversion is performed is explained, but, there is no problem even if a 12-bit A/D conversion is conducted. Further, although a subrange is divided into the high-order 3 bits and the low-order 5 bits, there is no problem even if a combination of other bit numbers is employed.

Here, in FIG. 4, all of the switches in the ADC circuit 152 are controlled to be turned on or off by a control part CTL1. Further, the control part CTL1 controls the coarse conversion and the fine conversion in accordance with the output of the comparator CP1. For example, in the coarse conversion, the switches SW1 to SW8 are turned on in order (the switches SW11 to SW18 are turned off in an exclusive manner) until when the output of the comparator CP1 is inverted, and the high-order 3 bits are determined at a point of time at which the output of the comparator CP1 is inverted, as explained in FIG. 5. Further, in the fine conversion, the switch SW21 is turned on (the switches SW1 and SW11 are turned off) to give the ramp voltage VRAMP to the capacitor C1, and the period of time from the timing T6 to the timing t1 at which the output of the comparator CP1 is inverted again is measured, and the low-order 5 bits are determined based on the time ratio. Further, the control part CTL1 combines the high-order 3 bits determined in the coarse conversion and the low-order 5 bits determined in the fine conversion, and outputs the resultant as a final 8-bit A/D conversion value. The integrating type A/D conversion is performed in a manner as described above.

Figure 6:
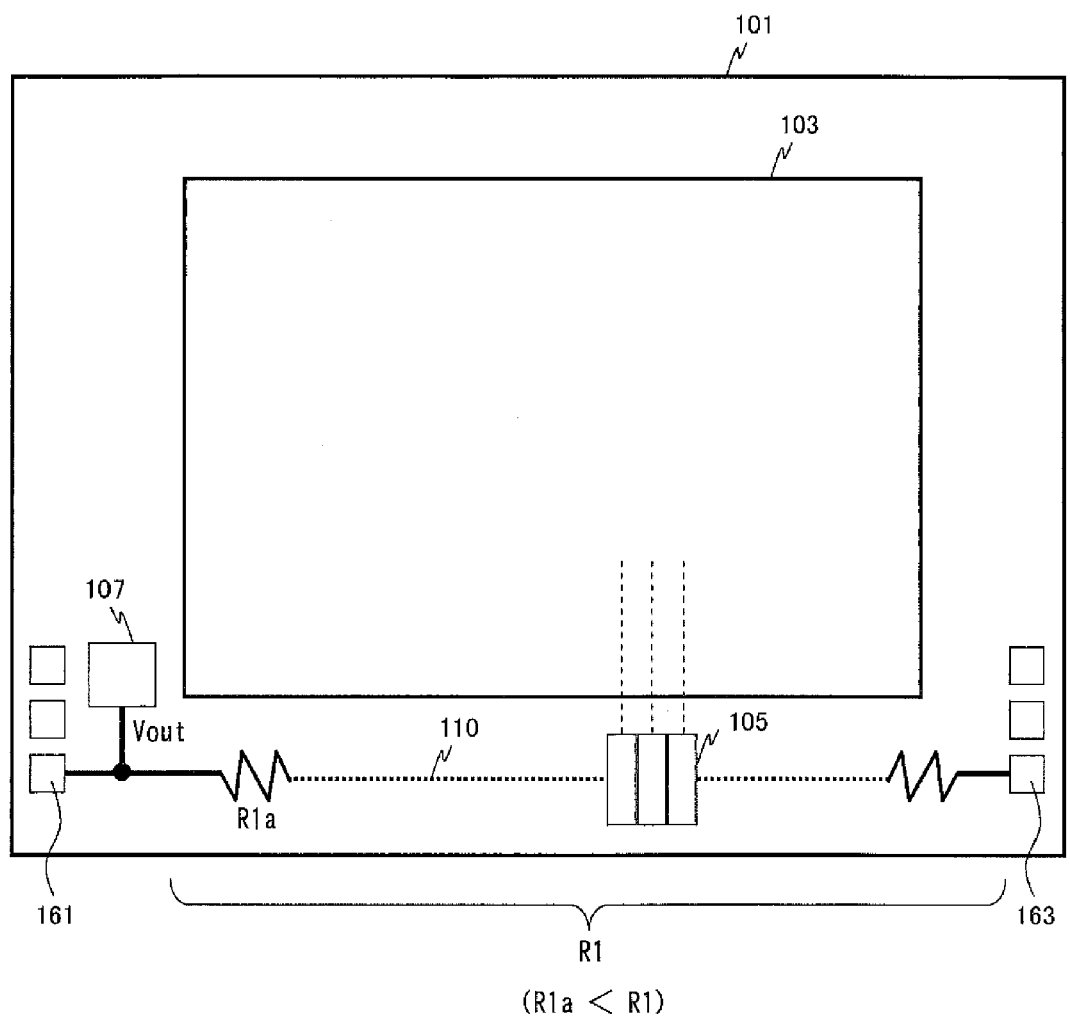
FIG. 6 is a diagram for explaining a wiring resistance on the solid state image sensor 101.
Figure 7:
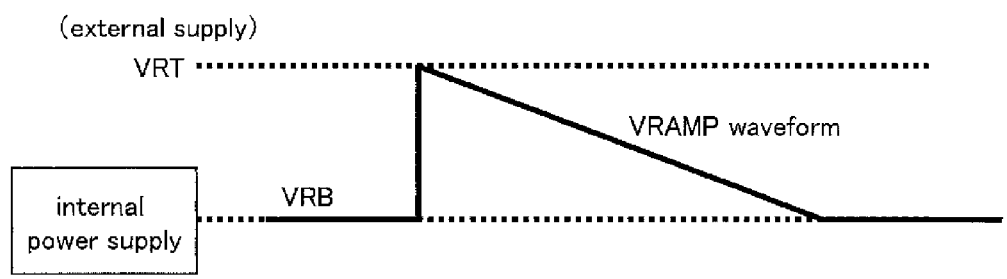
FIG. 7 is a diagram illustrating a power supply supplied to the integrating type A/D converter.

Next, a problem of the integrating type A/D converter when the voltage VRB is supplied from the internal power supply 107 will be described by using FIG. 6. FIG. 6 is a plan view of the solid state image sensor 101 of the imaging device 100. Note that in FIG. 6, a component denoted by the same reference numeral as that of FIG. 1 indicates the same component as that of FIG. 1. In FIG. 6, the internal power supply 107 provided in the solid state image sensor 101 is disposed on the left side of the pixel part 103, and an output Vout of the internal power supply 107 is given to the column circuits 105 of respective columns by the wiring 110 in the solid state image sensor 101. However, since the wiring 110 is routed over a long distance from the left end to the right end of the solid state image sensor 101, it has a wiring resistance R1 as a result of integrating a distributed resistance R1a (R1a<R1). Due to the wiring resistance, there arises a problem such that the voltage drop of the power supply given from the internal power supply 107 becomes large. Particularly, when the ADC circuit 152 is an integrating type A/D conversion circuit, the voltage VRT on the high voltage side and the voltage VRB on the low voltage side are given as a reference voltage giving a quantization range of A/D conversion, as illustrated in FIG. 7. Note that it is set that the output Vout of the internal power supply 107 gives the voltage VRB, and the voltage VRT is given from the outside of the imaging device 100. Further, the ramp voltage VRAMP is obtained by a circuit, inside of the solid state image sensor 101, in which the voltage is changed from the voltage VRT to the voltage VRB.

Here, regarding the voltage VRT supplied from the outside, since the voltage is supplied by an external pin, it can be supplied without being biased to the left end or the right end, and since a package wiring or the like is generally employed, it is possible to reduce an influence of voltage drop, when compared to a case where a wiring is performed only within the solid state image sensor 101 as the case of the internal power supply 107. On the contrary, as illustrated in FIG. 6, when the power supply is supplied from the internal power supply 107 disposed in the solid state image sensor 101, the wiring is performed within the solid state image sensor 101, but, in a full-size CMOS sensor, for example, it is not possible to sufficiently secure a line width and a thickness of the wiring 110 because of a miniaturization of element, so that the wiring resistance becomes large, which increases the voltage drop. Further, since the internal power supply 107 is disposed by being biased to the left end or the right end inside of the solid state image sensor 101 due to a limitation of layout, the length of wiring becomes long, resulting in that the influence of voltage drop is increased.

Also in the integrating type A/D converter illustrated in FIG. 4, if the voltage drop of the voltage VRB supplied from the internal power supply 107 becomes large, the above-described smear phenomenon (in a horizontal direction) easily occurs, similar to the case of another A/D converter. This is because, similar to the aforementioned example of A/D converter, when the voltage VRB is supplied from the internal power supply 107 disposed on one side of the solid state image sensor 101, since the wiring 110 is a common wiring, a flowing current becomes large when a strong light is incident and the voltage of the wiring 110 is varied, which exerts an influence on the ADC circuit 152 on another column, resulting in that the smear occurs.

Figure 8:
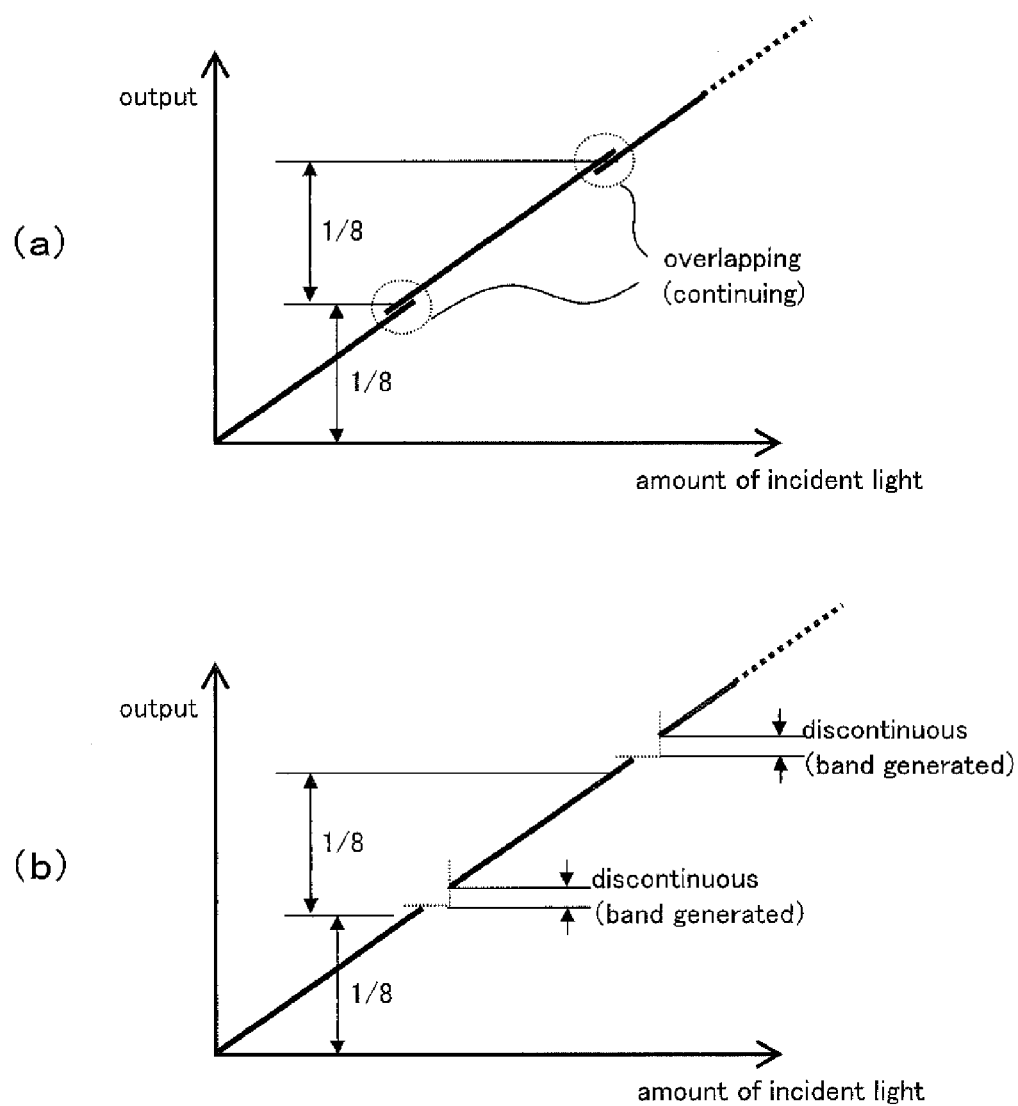
FIGS. 8(a) and 8(b) are diagrams for explaining a problem of the integrating type A/D converter.

Further, when the integrating type A/D converter is used, there also arises a problem regarding a level difference of subrange connection peculiar to the A/D converter. The level difference of subrange connection is a problem such that, since a signal level of a full-range signal in A/D conversion is determined by switching capacitors, the signal levels at the time of switching the capacitors become discontinuous due to a variation of the voltage VRB, resulting in that an accurate level determination cannot be conducted. For example, in FIG. 4 and FIG. 5, the voltage Vcm of the signal has to be dropped, in stages, by a voltage corresponding to (VRT−VRB)/8, every time one side of each of the capacitors from the capacitors C1 to C8 is switched from the voltage VRT to the voltage VRB, but, when the voltage drop due to the wiring resistance is large, the voltage VRB varies to be a voltage VRB', resulting in that the amount of voltage drop of the voltage Vcm does not become a voltage as a result of correctly dividing a potential difference of (VRT−VRB) into equal eight parts. Accordingly, there arises a problem such that characteristics of an amount of incident light and an A/D conversion output become discontinuous, resulting in that an image quality deteriorates. FIG. 8(a) and FIG. 8(b) are diagrams each illustrating characteristics in which a horizontal axis indicates an amount of incident light, and a vertical axis indicates an A/D conversion output. FIG. 8(a) illustrates ideal characteristics in which the characteristics are overlapped by ⅛ every time the voltage given to the capacitor is switched from the voltage VRT to the voltage VRB, and the voltage changes in a continuous manner. Note that in FIG. 8(a), the characteristics before and after the switching are illustrated in an exaggerated manner by being deviated a little in up and down directions, so that the overlapped portion of the characteristics before and after the switching can be easily understood. On the other hand, FIG. 8(b) illustrates characteristics when the voltage drop occurs due to the wiring resistance, in which the characteristics of the amount of incident light and the A/D conversion output become discontinuous at the time of the switching, resulting in that a band is generated. If the discontinuous characteristics as in FIG. 8(b) are generated, in a gradation image in which a brightness gradually changes, for example, an influence such that a band appears on a part with a specific brightness, is exerted on the image.

Figure 9:
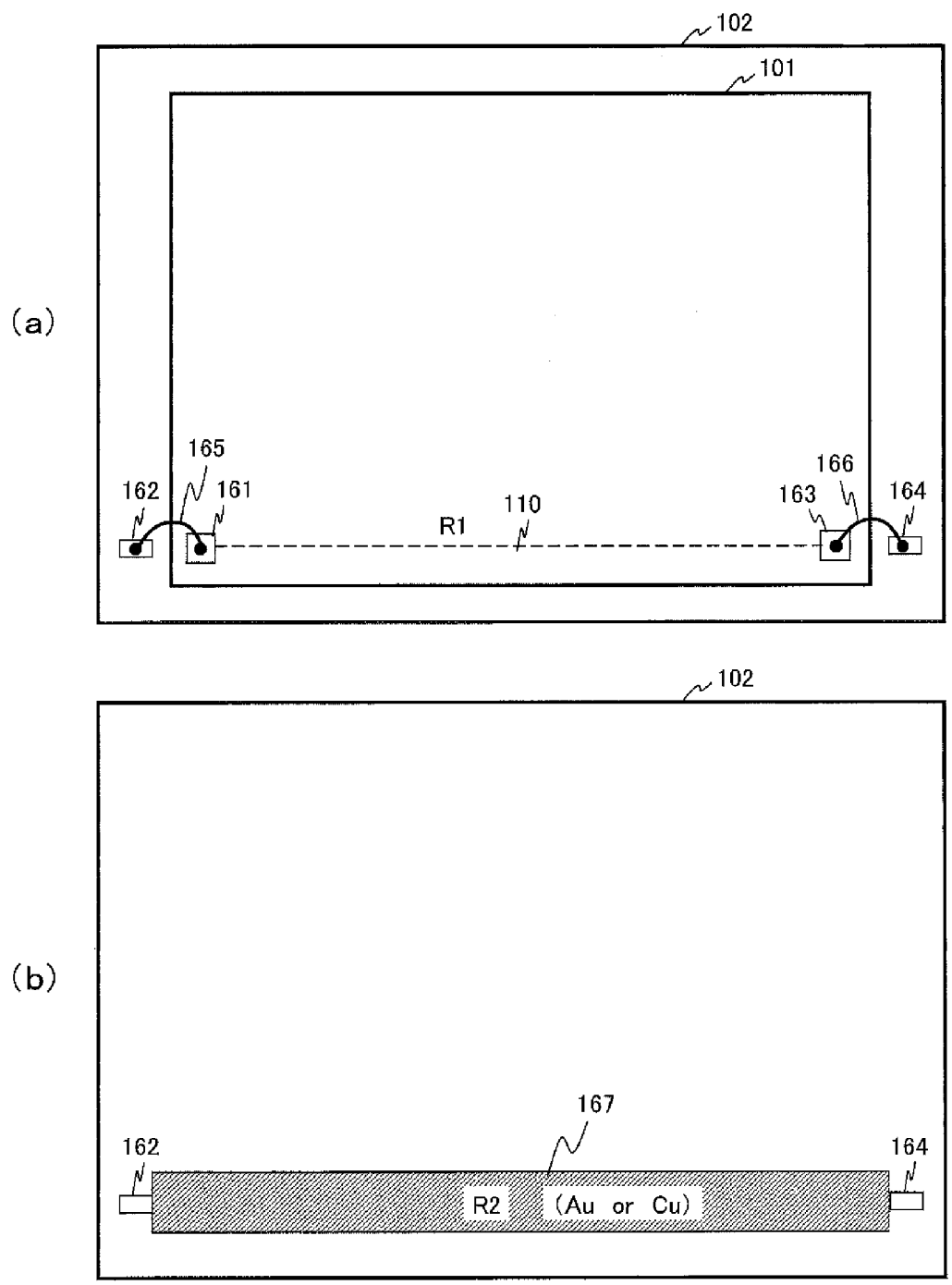
FIGS. 9(a) and 9(b) are diagrams illustrating an example of disposition of a wiring 110 and a wiring 167.

Accordingly, in the imaging device 100 according to the present embodiment, both ends of the wiring 110 of the solid state image sensor 101 are connected to the pads 161 and 163, respectively, on the solid state image sensor 101 side, and are further connected to the lead pins 162 and 164, respectively, on the package 102 side by the bonding wires 165 and 166, as illustrated in FIG. 9(*a*). Further, as illustrated in FIG. 9(*b*), the lead pin 162 and the lead pin 164 on the package 102 side are connected by the wiring 167 made of Au (gold) or Cu (copper) provided in the package 102. Note that the package 102 is configured by a staked-type package (formed of eight layers, or the like) made of a ceramic or a resin, so that the wiring 167 can be formed between layers.

As described above, in the imaging device 100 according to the present embodiment, when the power supply is supplied from the internal power supply 107 formed inside of the solid state image sensor 101, it is possible to reduce the wiring resistance of the power supply supplied from the internal power supply 107 by connecting the wiring 110 in the solid state image sensor 101 and the wiring 167 provided on the package 102 side in parallel. Accordingly, the voltage drop due to the wiring resistance becomes small, resulting in that the smear can be suppressed, and the problem such as the level difference of subrange connection peculiar to the integrating type A/D converter can be solved.

[Application Example with Respect to PGA Circuit 151]

In the above-described example, the case where the power supply is supplied from the internal power supply 107 to the A/D conversion circuit provided for each column is explained, but, the present invention does not have to be applied only to the A/D conversion circuit, and can be applied to all of conventional circuits in the column circuits 105 provided for respective columns to which the power supply is supplied from the internal power supply 107 in the solid state image sensor 101 with the use of an internal wiring, in which the wiring resistance can be lowered.

For example, also in a case where the bias power supply, a reference power supply (excluding one supplied from the outside) or the like is supplied from the internal power supply 107 provided in the solid state image sensor 101 to the PGA circuit 151 explained in FIG. 4, the present invention can be similarly applied. For example, when the bias power supply is supplied from the internal power supply 107, if a strong light is incident on pixels on the same row, problems arise such that the bias power supply varies and the smear occurs due to the high wiring resistance, and a level deviation of output occurs due to the deviation of bias voltage.

Even in such a case, in the imaging device 100 according to the present embodiment, it is possible to reduce the wiring resistance of the power supply supplied from the internal power supply 107 by providing the wiring 167 in the package 102 and connecting the wiring 167 and the wiring 110 in the solid state image sensor 101 in parallel, as illustrated in FIG. 2, so that it is possible to prevent the image quality deterioration due to the occurrence of smear and the like in the PGA circuit 151.

Note that the cases of the PGA circuit 151 and the ADC circuit 152 are explained in the above-described example, but, also in a case where the power supply is supplied from the internal power supply 107 provided in the solid state image sensor 101 to the circuits provided for each column (the column circuit 105, the pixel part 103 and the like), the present invention can be similarly applied, and it is possible to achieve an effect such that the wiring resistance of the power supply supplied from the internal power supply 107 can be reduced.

As above, the imaging device according to the present invention has been described by citing examples in the respective embodiments, but, the present invention can be embodied in other various forms without departing from the spirit or essential characteristics thereof. The above embodiments are therefore to be considered in all respects as illustrative and not restrictive. The present invention is indicated by the scope of appended claims, and in no way limited by the text of the specification. Moreover, all modifications and changes that fall within the equivalent scope of the appended claims are deemed to be within the scope of the present invention.

EXPLANATION OF NUMERALS AND SYMBOLS

100 . . . Imaging device; 101 . . . Solid state image sensor; 102 . . . Package; 103 . . . Pixel part; 104 . . . Vertical scanning circuit; 105 . . . Column circuit; 106 . . . Horizontal output circuit; 107 . . . Internal power supply; 110 . . . Wiring; 151 . . . PGA circuit; 152 . . . ADC circuit; 161, 163 . . . Pad; 162, 164 . . . Lead pin; 165, 166 . . . Bonding wire; 167 . . . Wiring; 168 . . . External pin; 180 . . . Sample-and-hold circuit; 181 . . . Comparator; 182 . . . Counter; 183 . . . D/A converter; 184 . . . Decoder; p Pixel; VLINE . . . Vertical signal line; SPL1, SPL2 . . . Switch; C1 to C8, C10, C11 . . . Capacitor; C12 . . . Variable capacitor; PGA_AZ, ADC_AZ . . . Switch; TSW, SPL1, SPL2 . . . Switch; SW1 to SW8, SW11 to SW18, SW21 . . . Switch; CP1 . . . Comparator; OP1 . . . Operational amplifier; CTL1 . . . Control part The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to exact construction and operation illustrated and described, and accordingly all suitable modifications and equivalents may be resorted to, falling within the scope thereof.

The invention claimed is:

1. An image sensor comprising:
   a pixel array having a plurality of pixels outputting a signal generated from photoelectric-converted electric charge to a signal line;
   a plurality of signal processing parts being connected to the signal line and performing signal processing on the signal output to the signal line;
   a first wiring being a wire connected to the plurality of signal processing parts and providing a voltage from a power supply part to the signal processings parts, in which the voltage is to drive the signal processing parts;
   a first pad arranged at an outer side than the pixel array and connected to the first wiring; and
   a second pad arranged at the outer side than the pixel array and being a pad different from the first pad which is connected to the first wiring,
   wherein wiring resistance of the first wiring is connected in parallel with wiring resistance of a second wiring via the first pad and the second pad.

2. The image sensor according to claim 1, wherein each end of the first wiring is connected to a respective terminal to be connected to the second wiring.

3. The image sensor according to claim 2, wherein the wiring resistance of the first wiring is connected in parallel with the wiring resistance of the second wiring by the terminals.

4. The image sensor according to claim 1, wherein a width of the first wiring is smaller than a width of the second wiring.

5. The image sensor according to claim 1, wherein the signal processing part includes an amplifier which amplifies the signal.

6. The image sensor according to claim 1, wherein the signal processing part includes a comparator used for converting the signal into a digital signal.

7. An imaging device comprising:

an image sensor which has a pixel array having a plurality of pixels outputting a signal generated from photoelectric-converted electric charge to a signal line, a plurality of signal processing parts being connected to the signal line and performing signal processing on the signal output to the signal line, a first wiring being a wire connected to the plurality of signal processing parts and providing a voltage from a power supply part to the signal processing parts, in which the voltage is to drive the signal processing parts, a first pad arranged at an outer side than the pixel array and connected to the first wiring, and a second pad arranged at the outer side than the pixel array and being a pad different from the first pad which is connected to the first wiring; and a mounting substrate having a second wiring to be connected to the first wiring via the first pad and the second pad and mounting the image sensor, wherein wiring resistance of the first wiring is connected in parallel with wiring resistance of the second wiring.

8. The imaging device according to claim 7, wherein on the image sensor, a respective first terminal is arranged at each end of the first wiring to be connected to the second wiring, and on the mounting substrate, a respective second terminal is arranged at each end of the second wiring to be connected to the first wiring.

9. The imaging device according to claim 8, wherein the wiring resistance of the first wiring is connected in parallel with the wiring resistance of the second wiring by the first terminals and the second terminals.

10. The imaging device according to claim 7, wherein a width of the first wiring is smaller than a width of the second wiring.

11. The imaging device according to claim 7, wherein the signal processing part includes an amplifier which amplifies the signal.

12. The imaging device according to claim 7, wherein the signal processing part includes a comparator used for converting the signal into a digital signal.

13. The imaging device according to claim 7, wherein the mounting substrate is formed by a ceramic.

14. The imaging device according to claim 7, wherein the mounting substrate is formed by a resin.

15. The imaging device according to claim 7, wherein the mounting substrate is formed by stacking a plurality of wirings including the second wiring.

* * * * *